United States Patent [19]

Narita

[11] Patent Number: 5,710,452
[45] Date of Patent: Jan. 20, 1998

[54] SEMICONDUCTOR DEVICE HAVING ELECTROSTATIC BREAKDOWN PROTECTION CIRCUIT

[75] Inventor: Kaoru Narita, Tokyo, Japan

[73] Assignee: NEC Corporation, Tokyo, Japan

[21] Appl. No.: 627,093

[22] Filed: Apr. 3, 1996

[30] Foreign Application Priority Data

Apr. 3, 1995 [JP] Japan ............................... 7-077001

[51] Int. Cl.$^6$ ............................................. H01L 23/62
[52] U.S. Cl. .................... 257/355; 257/356; 257/361; 257/362
[58] Field of Search ......................... 257/361, 362, 257/355, 356

[56] References Cited

U.S. PATENT DOCUMENTS

| | | | |
|---|---|---|---|
| 4,924,339 | 5/1990 | Atsumi et al. | 257/362 X |
| 4,962,320 | 10/1990 | Okada et al. | 361/56 |
| 4,994,874 | 2/1991 | Shimizu et al. | 257/362 |
| 5,268,588 | 12/1993 | Marum | 257/362 |

FOREIGN PATENT DOCUMENTS

| | | | |
|---|---|---|---|
| 0225586 | 6/1987 | European Pat. Off. | 257/362 |
| 239570 | 2/1990 | Japan . | |
| 5335494 | 12/1993 | Japan | 257/362 |

OTHER PUBLICATIONS

"Internal ESD Transients in Input Protection Circuits", IEEE, Y. Fong and C. Hu, 1989, pp. 77-81.

Primary Examiner—William Mintel
Attorney, Agent, or Firm—Sughrue, Mion, Zinn, Macpeak & Seas, PLLC

[57] ABSTRACT

A semiconductor device includes a metallic main line connected between an external terminal and an internal circuit, and a plurality of divided protection bipolar transistors connected in parallel to one another. Each of the divided protection bipolar transistors includes a collector and an emitter composed of first and second N diffused regions formed in a semiconductor substrate which are separated from each other. Each of the divided protection bipolar transistors also includes a base formed of a portion of a semiconductor substrate between the collector and the emitter. The collector is connected to a metallic sub line branched from the main line, and the emitter is connected to ground. The plurality of divided protection bipolar transistors have an equal breakdown voltage between the collector of the divided protection bipolar transistor and the semiconductor substrate. Thus, the protection device composed of a plurality of divided protection bipolar transistors connected in parallel to one another can effectively protect the internal circuit from a short electrostatic pulse.

6 Claims, 9 Drawing Sheets

SEMICONDUCTOR DEVICE HAVING ELECTROSTATIC BREAKDOWN PROTECTION CIRCUIT

BACKGROUND OF THE INVENTION

1. Field of the Invention

The present invention relates to a semiconductor device, and more specifically to an electrostatic breakdown protection device for use in a MOS (metal-oxide-semiconductor field effect transistor) semiconductor integrated circuit.

2. Description of Related Art

For example, Japanese Patent Application Laid-open Publication No. JP-A-02-039570 (which corresponds to U.S. Pat. No. 4,962,320, the disclosure of which is incorporated by reference in its entirety into this application) discloses a conventional electrostatic breakdown protection technology for a MOS semiconductor integrated circuit.

Referring to FIG. 1, a typical conventional MOS semiconductor integrated circuit includes an input inverter circuit 4 having an input connected to receive through a first resistor 51 and a second resistor 52 a signal applied to an input terminal 1. Bipolar transistors 21 and 22 are connected between a signal line and ground, in order to prevent an overvoltage from being applied to a gate of transistors in the inverter circuit 4 when the overvoltage is applied to the input terminal 1, thereby preventing elevation of a voltage between the gate of the transistors and a substrate, which would otherwise break down a gate oxide film in the transistors.

Namely, when the overvoltage is applied to the input terminal 1, the bipolar transistors 21 and 22 are turned on to avoid elevation of the gate voltage in the inverter circuit. These bipolar transistors 21 and 22 are fabricated as a lateral type parasitic bipolar transistor as shown in FIG. 2, in a process for manufacturing the MOS semiconductor integrated circuit. As shown in FIG. 2 illustrating a layout of the input terminal (pad), the first resistor 51 and the first parasitic bipolar transistor 21. A collector and an emitter of the parasitic bipolar transmitter 21 are constructed from a pair of elongated N-type diffused layers 121 and 122 formed in a P-type substrate. The layer 121 and 122 are separated from each other by a very narrow distance but extend parallel to each other.

FIG. 3 is a diagrammatic sectional view taken along the line III—III in FIG. 2. As shown in FIG. 3, the collector and the emitter constituted of the N-type diffused layers 121 and 122 formed in a P-type substrate 11, are separated from each other by a device isolation insulator film 14.

Here, a problem of the above mentioned conventional lateral parasitic bipolar transistor will be discussed on the basis of experimental data.

For example, if a voltage pulse as shown in FIG. 4A is applied to a parasitic bipolar transistor having an emitter and a collector each having a width "W" of 100 μm, there flows a current having a current waveform as shown in FIG. 4B. Namely, the current reaches a maximum about 30 nsec delayed from a edge rising of the voltage pulse. At 10 nsec from the rising edge of the voltage pulse, the current reaches only a half of the maximum current value.

A cause for this can be considered as follows: When an overvoltage such as an electrostatic pulse is applied, the whole of the bipolar transistor is not simultaneously turned on. A local region such as an end region of the collector N-type diffused region (as designated by Reference Sign "a" in FIG. 2) in which an avalanche breakdown is apt to occur easily, is first put into an operating condition of the parasitic bipolar transistor, and thereafter, the region of the operating condition of the parasitic bipolar transistor spreads with time, so that the whole of the width ("W" in FIG. 2) of the protection parasitic bipolar transistor is finally put into the operating condition of the parasitic bipolar transistor.

This spreading speed depends upon application condition of the overvoltage pulse. In the case of the protection parasitic bipolar transistor having the width of 100 μm, a time of about 30 nsec to 40 nsec is taken until the whole of the width is put into the operating condition. At 10 nsec after the rising of the voltage pulse, about a half of the protection parasitic bipolar transistor is turned on. Accordingly, if an applied pulse is based on a MIL standard, namely, when the applied pulse is a relatively, long pulse needing a discharge time on the order of 160 nsec, the whole of the width of the protection parasitic bipolar transistor is put into the operating condition during application period of the pulse, and therefore, an electric charge of the applied pulse can be discharged efficiently.

However, when there is applied a pulse having a discharge time which is on the order of one tenth of the discharge time of the just above mentioned pulse, only a portion of the whole width of the protection parasitic bipolar transistor is put into the operating condition, and therefore, an impedance of the protection parasitic bipolar transistor does not sufficiently drop, with the result that the voltage applied to an internal circuit to be protected adversely elevates, resulting in a dropped electrostatic breakdown strength.

SUMMARY OF THE INVENTION

Accordingly, it is an object of the present invention to provide an electrostatic breakdown protection device for use in a MOS semiconductor integrated circuit, which has overcome the above mentioned defect of the conventional one.

Another object of the present invention is to provide an electrostatic breakdown protection device for use in a MOS semiconductor integrated circuit, capable of sufficiently protecting an internal circuit from an accidently applied electrostatic pulse having a short pulse width.

The above and other objects of the present invention are achieved in accordance with the present invention by a semiconductor device comprising an external metal terminal formed on a semiconductor substrate of a first conductivity type, an internal circuit formed in the semiconductor substrate and connected to the external metal terminal, and a protection bipolar transistor having a collector region and an emitter region formed in the semiconductor substrate, separately from each other by a device isolation insulator film formed on the semiconductor substrate, each of the collector region and the emitter region being formed of a second conductivity type opposite to the first conductivity type, and an emitter of the protection bipolar transistor being formed of a portion of the semiconductor substrate between the collector region and the emitter region, the collector region being connected to the metal terminal, and the emitter region being connected to a predetermined common potential, so that when an electrostatic voltage is applied to the metal terminal, the protection bipolar transistor is turned on so as to protect the internal circuit, wherein the improvement comprises a plurality of divided protection transistors which constitute the protection bipolar transistor as a whole, each of the divided protection transistors having a predetermined limited width, and the divided protection transistors having a substantially equal breakdown voltage of a junction between a collector region and the semiconductor substrate.

In one embodiment, the divided protection transistor has a base region ion-implanted with boron.

The above and other objects, features and advantages of the present invention will be apparent from the following description of preferred embodiments of the invention with reference to the accompanying drawings.

DESCRIPTION OF THE PREFERRED EMBODIMENTS

Figure 1:
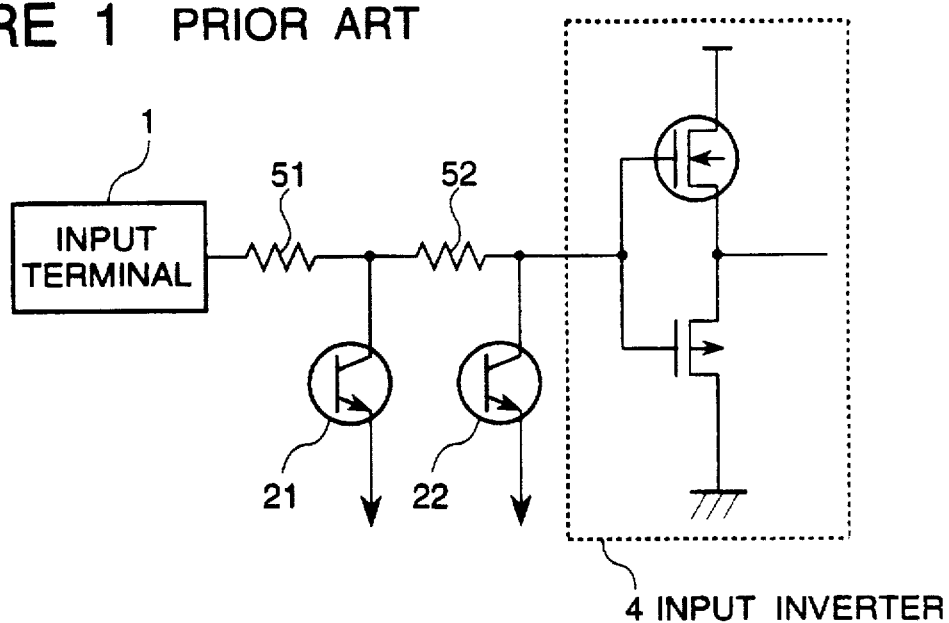
FIG. 1 is a circuit diagram illustrating a typical prior art input protection circuit used in a MOS semiconductor integrated circuit.
Figure 4A:
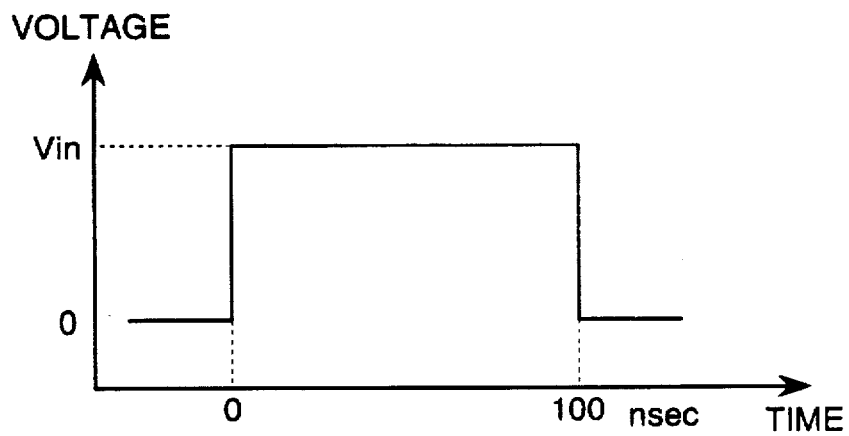
FIGS. 4A and 4B are graphs illustrating a characteristics of the prior art input protection circuit shown in FIG. 1.
Figure 4B:
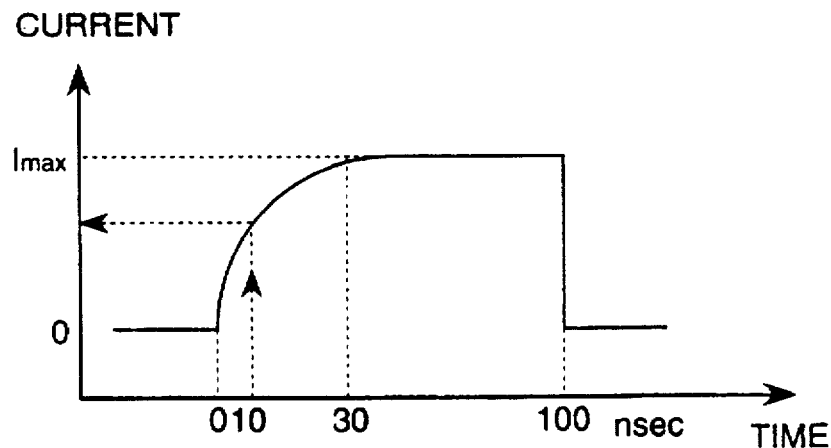
Figure 2:
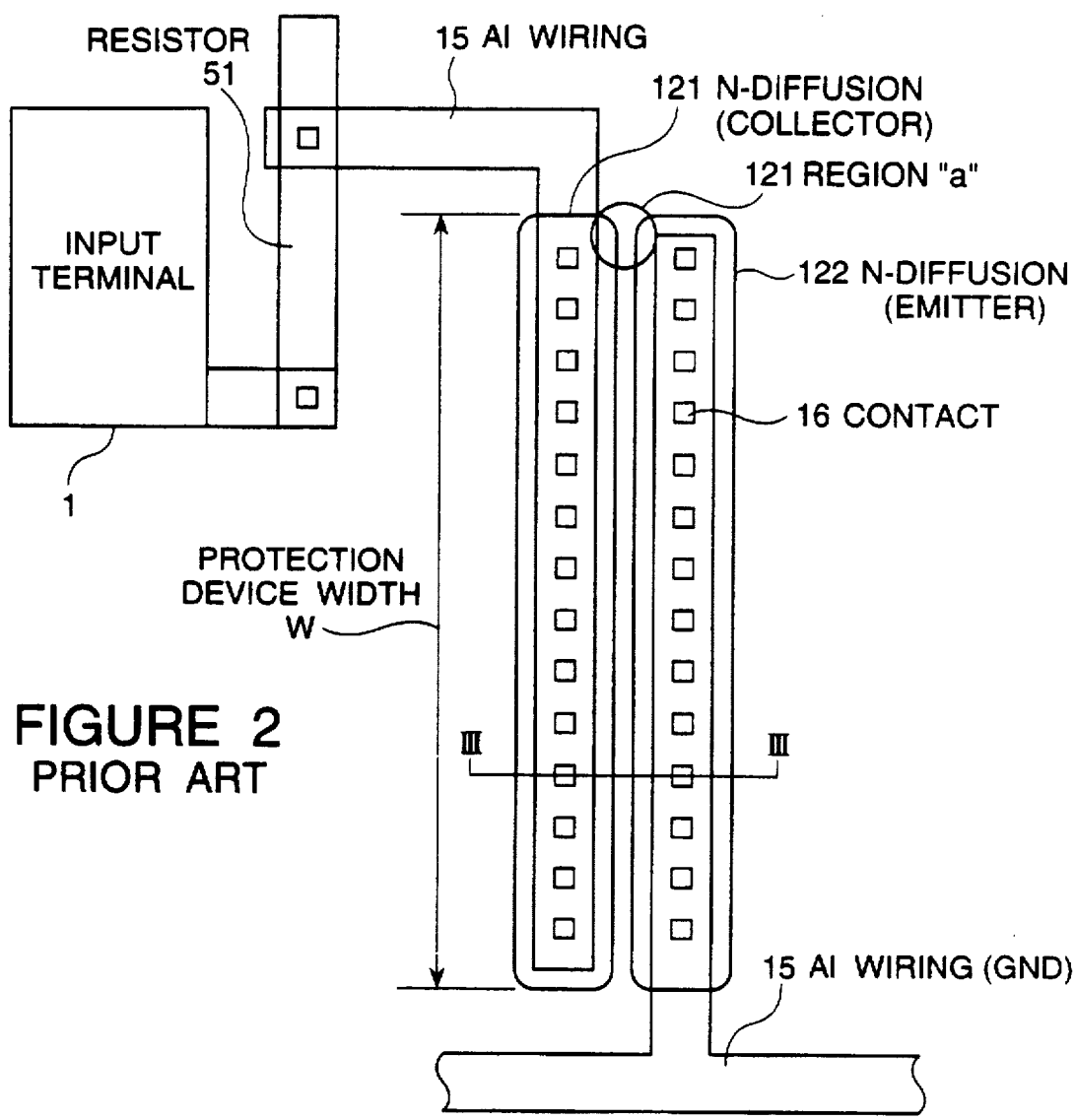
FIG. 2 is a diagrammatic layout of a portion of the prior art input protection circuit shown in FIG. 1.
Figure 3:
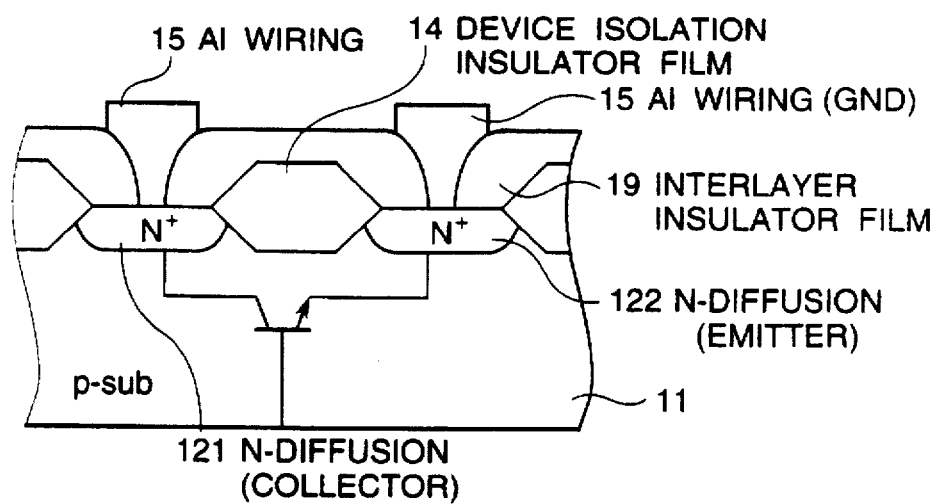
FIG. 3 is a diagrammatic sectional view taken along the line III—III in FIG. 2.
Figure 5:
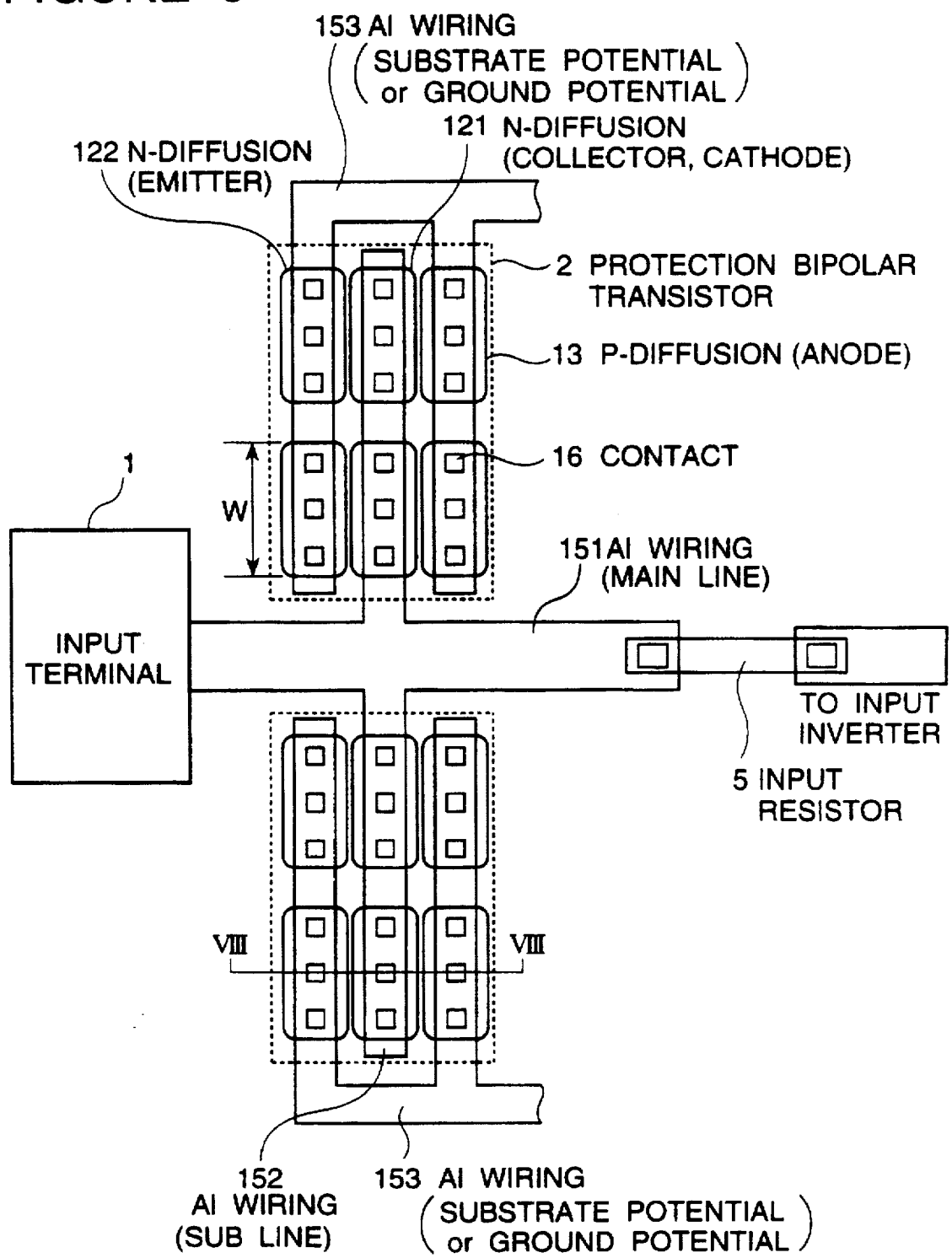
FIG. 5 is a diagrammatic layout of a portion of a first embodiment of the electrostatic breakdown protection circuit in accordance with the present invention.

Referring to FIG. 5, there is shown a diagrammatic layout of a portion of a first embodiment of the electrostatic breakdown protection circuit in accordance with the present invention, which is fabricated in accordance with a conventional process for manufacturing a MOS semiconductor integrated circuit. Furthermore, referring to FIG. 6, there is shown a circuit diagram illustrating an input buffer circuit applied with the first embodiment of the electrostatic breakdown protection circuit in accordance with the present invention shown in FIG. 5.

Figure 6:
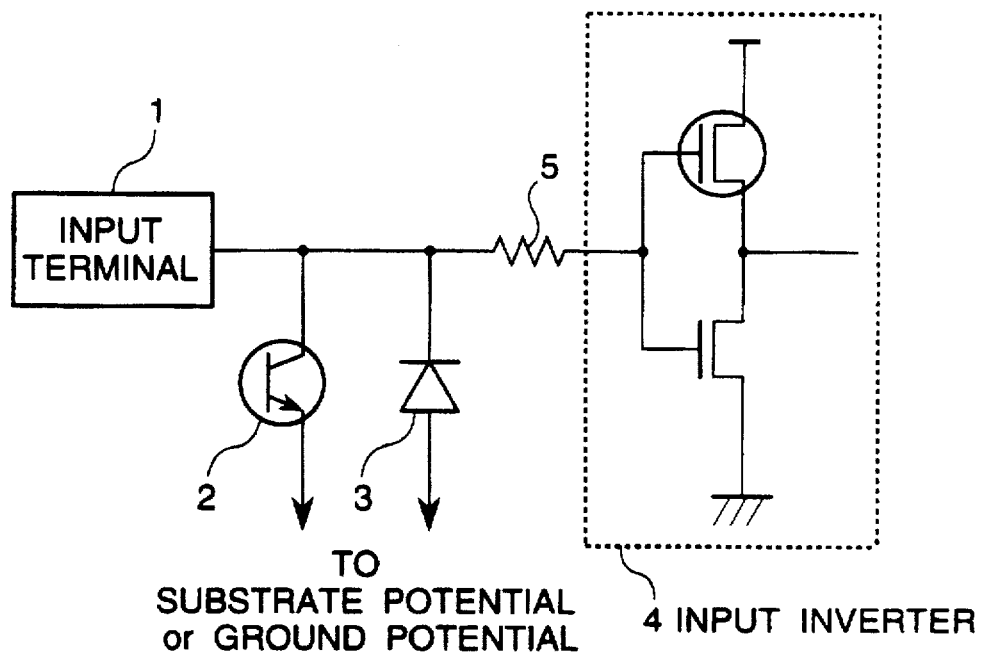
FIG. 6 is a circuit diagram illustrating an input buffer circuit applied with the first embodiment of the electrostatic breakdown protection circuit in accordance with the present invention shown in FIG. 5.

As shown in FIG. 6, an input signal applied to an input external metal terminal 1 is supplied through a resistor 5 to an input inverter circuit 4. A protection bipolar transistor 2 and a protection diode 3 are connected to a path between the input terminal 1 and the resistor 5, in order to prevent the destruction of the circuit when an overvoltage is accidentally applied to the input terminal 1. Specifically, the protection bipolar transistor 2 has a collector connected to the path between the input terminal 1 and the resistor 5, and an emitter connected to a substrate (potential) or a ground potential. The protection diode 3 has a cathode connected to the path between the input terminal 1 and the resistor 5, and an anode also connected to the substrate (potential) or the ground potential.

With this arrangement, when the overvoltage applied to the input terminal 1 is positive, the protection bipolar transistor 2 is turned on so as to cause a current based on the positive overvoltage to flow to the substrate potential or the a ground potential, thereby preventing a large positive voltage from being applied to a gate in the input inverter circuit. When the overvoltage applied to the input terminal 1 is negative, the protection diode 3 is turned on so as to cause a current based on the negative overvoltage to flow from the substrate potential or the ground potential, thereby preventing a large negative voltage from being applied to the gate in the input inverter circuit.

Figure 7:
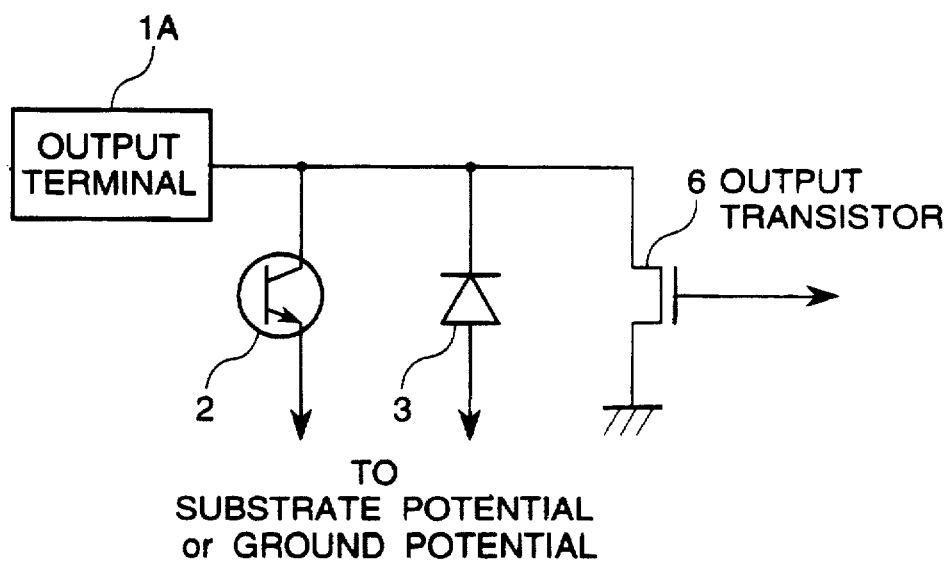
FIG. 7 is a circuit diagram illustrating an output circuit applied with the first embodiment of the electrostatic breakdown protection circuit in accordance with the present invention shown in FIG. 5.

Referring to FIG. 7, there is shown a circuit diagram illustrating an output circuit applied with the first embodiment of the electrostatic breakdown protection circuit in accordance with the present invention shown in FIG. 5. The circuit shown in FIG. 7 has the same construction as that shown in FIG. 6, except that the input terminal 1 shown in FIG. 6 is replaced with an output terminal 1A shown in FIG. 7, the input inverter circuit 4 shown in FIG. 6 is replaced with an output MOS transistor 6 shown in FIG. 7, and the output terminal 1A is connected to one end of the output MOS transistor 6 without an intermediary, such as the resistor 5. A protection operation of the circuit shown in FIG. 7 is the same as that shown in FIG. 6, and therefore, an explanation thereof will be omitted.

Returning to FIG. 5, the diagrammatic layout shown in FIG. 5 precisely illustrates the circuit shown in FIG. 6 excluding the input inverter circuit 4. The shown structure includes a main line 151 of an aluminum wiring connected at one end to the input terminal 1 and at the other end to the resistor 5. The main line 151 of the aluminum wiring also includes a pair of sub lines 152 of an aluminum wiring extending perpendicularly from the main line 151 in opposite directions. Each of the pair of sub lines 152 is connected through a plurality of contacts to a plurality of N-type diffused layers 121 which are formed in a semiconductor substrate under the sub line and which acts as a collector of the protection bipolar transistor and a cathode of the protection diode.

Figure 8:
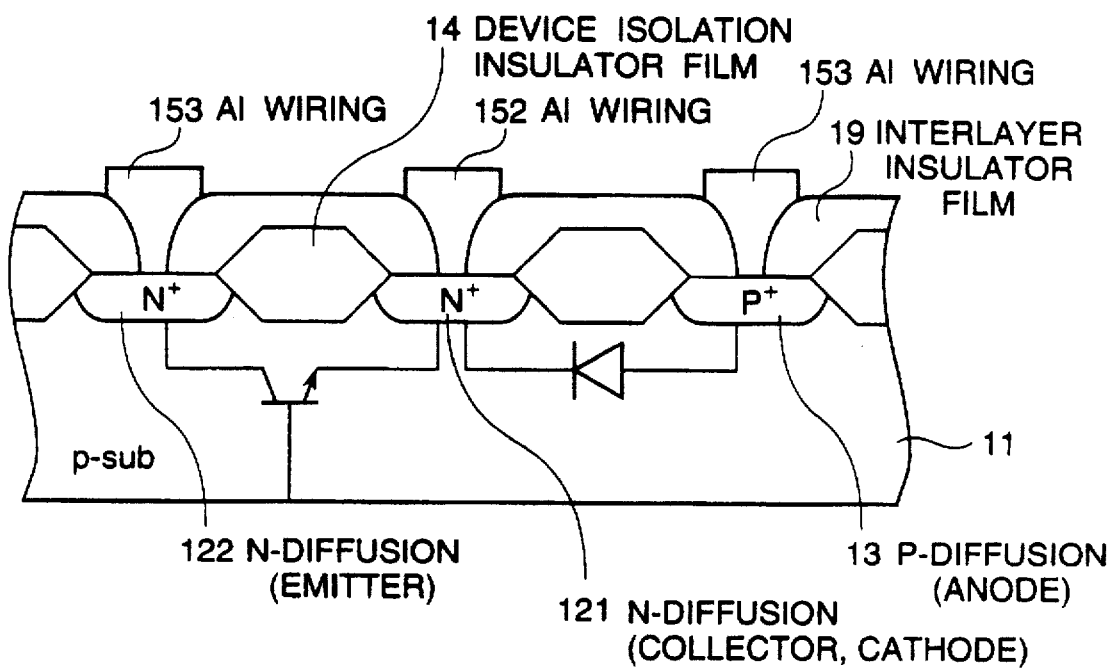
FIG. 8 is a diagrammatic sectional view taken along the line VIII—VIII in FIG. 5.

As shown in FIG. 8, which is a diagrammatic sectional view taken along the line VIII—VIII in FIG. 5, the protection structure includes the N-type diffused layer 121 which is formed in a principal surface of a P-type semiconductor substrate 11. In FIG. 8, at a left side of the N-type diffused layer 121, another N-type diffused layer 122 is formed in the principal surface of the P-type semiconductor substrate 11, separately from the N-type diffused layer 121. In addition, at a right side of the N-type diffused layer 121, a P-type diffused layer 13 is formed in the principal surface of the P-type semiconductor substrate 11, separately from the N-type diffused layer 121. The N-type diffused layers 121 and 122 are isolated from each other by a device isolation insulator film 14 which is formed in the principal surface of the P-type semiconductor substrate 11 between the N-type diffused layers 121 and 122. The N-type diffused layer 121 and the P-type diffused layer 13 are isolated from each other by a device isolation insulator film 14 which is formed in the principal surface of the P-type semiconductor substrate 11 between the N-type diffused layer 121 and the P-type diffused layer 13. Furthermore, An interlayer insulator film 16 is formed to cover the whole of the device isolation insulator film and the diffused layers.

The N-type diffused layer 121 is connected to the sub line 152 of the aluminum wiring through contact holes formed in the interlayer insulator film 16, and the N-type diffused layer 122 is connected to an aluminum wiring 153 through contact holes formed in the interlayer insulator film 16. Furthermore, the P-type diffused layer 13 is connected to an aluminum wiring 153 through contact holes formed in the interlayer insulator film 16. The aluminum wiring 153 is connected to the substrate potential or the ground potential.

With the above mentioned construction as shown in FIG. 8, a protection bipolar transistor is constituted of an NPN bipolar transistor which includes a collector formed of the N-type diffused layer 121, a base formed of the P-type substrate 11 and an emitter formed of the N-type diffused layer 122. On the other hand, a protection diode is constituted of a PN junction formed between the N-type diffused layer 121 and the P-type substrate 11 which is connected to the P-type diffused layer 13.

Thus, one protection unit composed of one protection bipolar transistor and one protection diode is formed as shown in FIG. 8, and as shown in FIG. 5, two protection units are formed for each of the sub lines 152 so that four protection units are formed in total for the main line 151. A width of each of the protection units is for example 20 µm.

Therefore, when an overvoltage is applied to the input terminal, a parasitic bipolar transistor starts to operate at an end of each protection unit. However, since each protection unit is narrow in width, a time until the operation of the parasitic bipolar transistor extends over the whole of each protection unit, is not larger than 5 nsec. Accordingly, even if a very short overvoltage pulse is applied, the protection device can effectively operate to prevent the overvoltage from being applied to an internal circuit.

An electrostatic breakdown strength can be elevated by increasing the total width of the protection bipolar transistor, namely, the number of the protection units. In this connection, even if the number of the protection units is increased, when a very short overvoltage pulse is applied, each of the protection units operates effectively, and therefore, the electrostatic breakdown strength is in proportion to the total width of the protection units.

Incidentally, when the electrostatic breakdown protection circuit shown in FIG. 5 is applied to the output circuit shown in FIG. 7, the resistor 5 is omitted.

Figure 9:
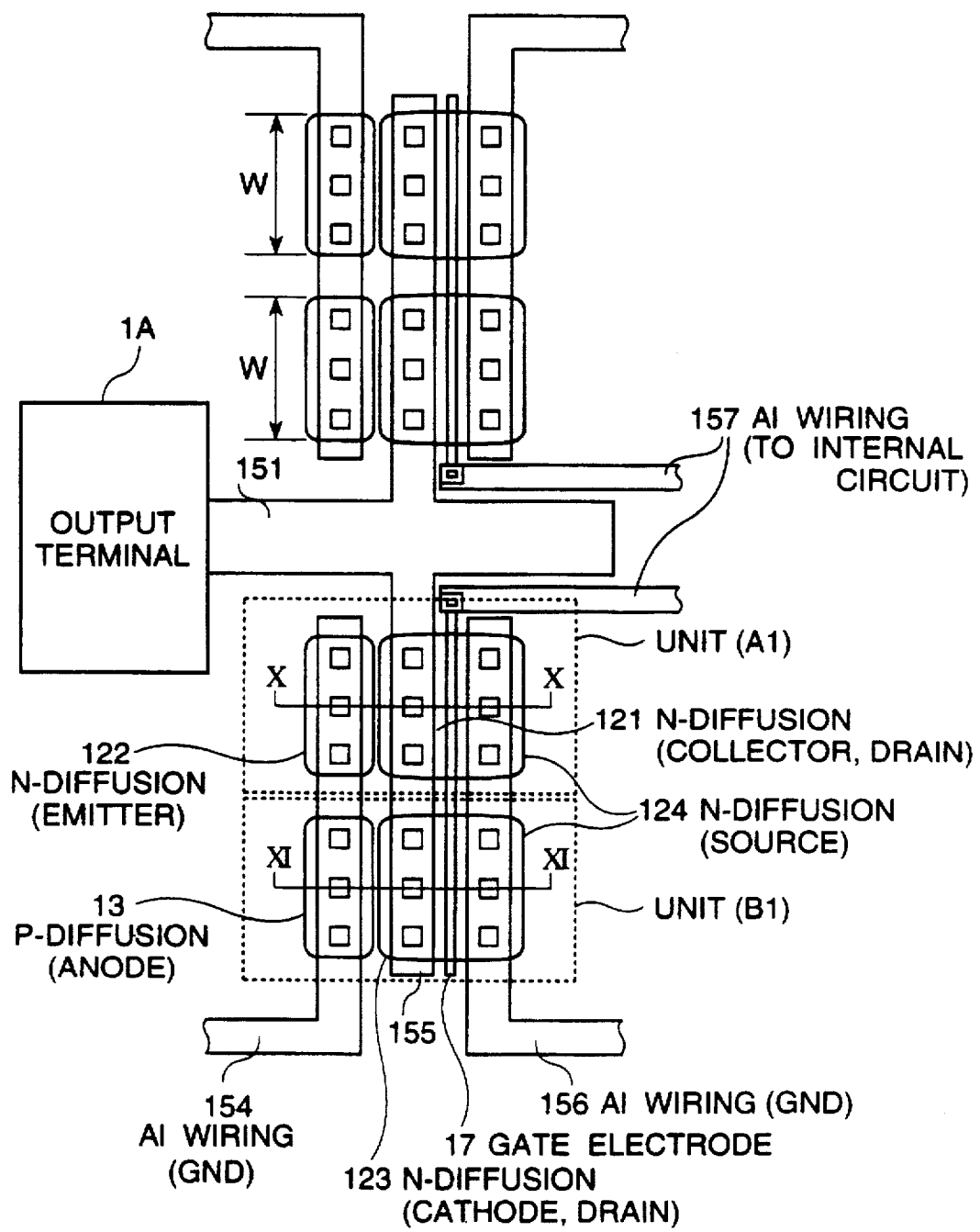
FIG. 9 is a diagrammatic layout of a portion of a second embodiment of the electrostatic breakdown protection circuit in accordance with the present invention.

Referring to FIG. 9, there is shown a diagrammatic layout of a portion of a second embodiment of the electrostatic breakdown protection circuit in accordance with the present invention, which is fabricated in accordance with a process similar to the process for manufacturing the first embodiment, and which can constitute the output protection circuit shown in FIG. 7.

The second embodiment includes, at each side of the main line 151 connected to an output external metal terminal 1A, a first protection unit A1 having an N diffused layer 121 formed in common to a drain of an output transistor and a collector of a protection bipolar transistor, and a second protection unit B1 having an N diffused layer 123 which is formed in common to the drain of the output transistor and a cathode of a protection diode.

Figure 10:
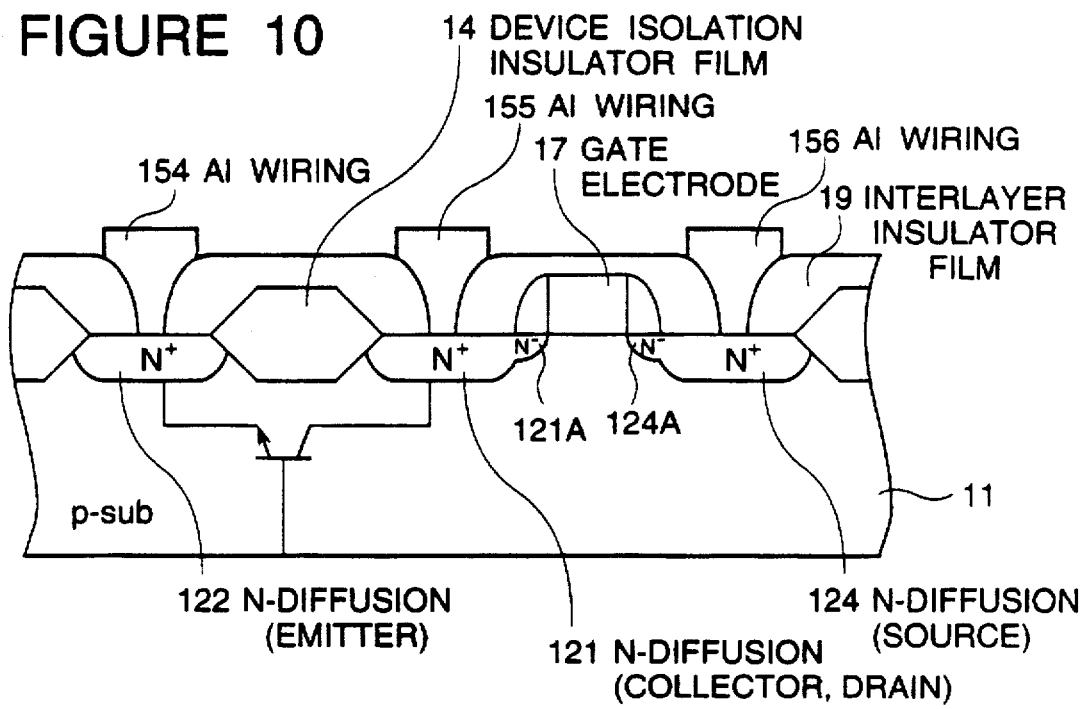
FIG. 10 is a diagrammatic sectional view taken along the line X—X in FIG. 9.

As shown in FIG. 10 which is a diagrammatic sectional view taken along the line X—X in FIG. 9, the protection bipolar transistor is composed of a collector consisting of the N diffused layer 121 formed in a principal surface of a P-type silicon substrate 11, a base formed of the P-type silicon substrate 11 itself, and an emitter consisting of another N diffused layer 122 which is formed in the principal surface of a P-type silicon substrate 11, isolated from the N diffused layer 121 by a device isolation insulator film 14. On the other hand, the output MOS transistor is a LDD (lightly doped drain) transistor composed of a drain consisting of the N diffused layer 121, a source consisting of an N diffused layer 124 which is formed in the principal surface of the P-type silicon substrate 11, separately from the N diffused layer 121, and a gate electrode 17 located through a gate insulator film (not shown for simplification of the drawing) on the principal surface of the P-type silicon substrate 11 between the N diffused layer 121 and the N diffused layer 124. The N diffused layer 121 and the N diffused layer 124 have a lightly doped region 121A and 124A in a portion adjacent to the gate electrode.

Figure 11:
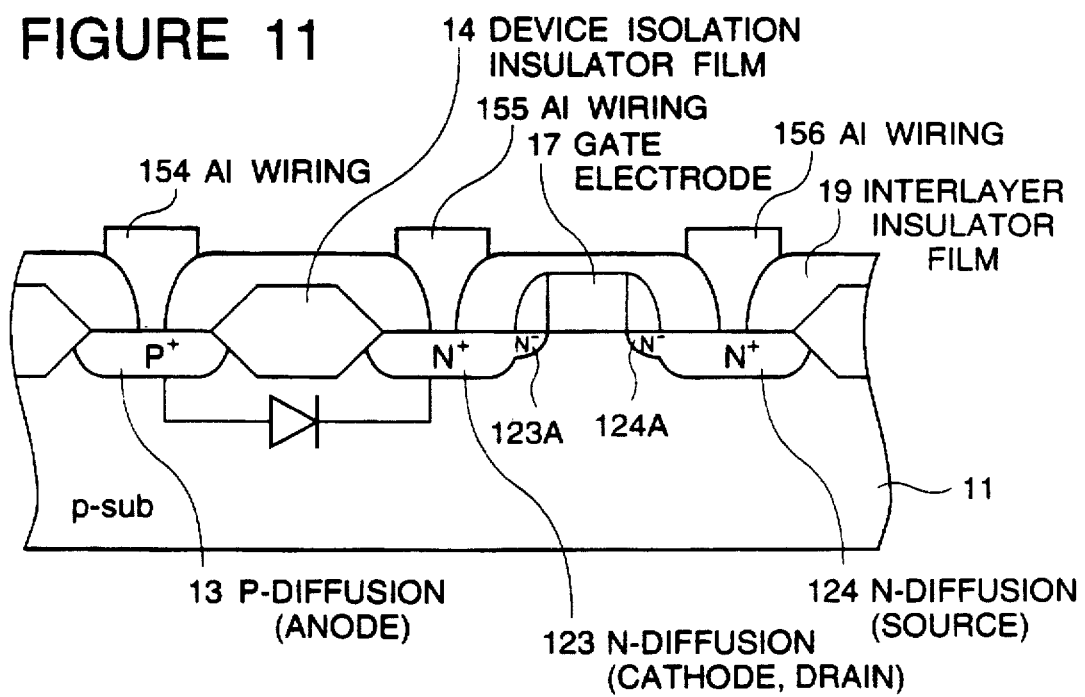
FIG. 11 is a diagrammatic sectional view taken along the line XI—XI in FIG. 9.

As shown in FIG. 11 which is a diagrammatic sectional view taken along the line XI—XI in FIG. 9, the protection diode is composed of a PN junction between a cathode formed of the N diffused layer 123 formed in a principal surface of a P-type silicon substrate 11, and an anode formed of the P-type silicon substrate 11 itself which is connected to a P diffused layer 13 which is formed in the principal surface of a P-type silicon substrate 11, isolated from the N diffused layer 123 by a device isolation insulator film 14. On the other hand, the output MOS transistor is an LDD transistor composed of a drain consisting of the N diffused layer 123, a source consisting of an N diffused layer 124 which is formed in the principal surface of the P-type silicon substrate 11, separated from the N diffused layer 123, and a gate electrode 17 located through a gate insulator film (not shown for simplification of the drawing) on the principal surface of the P-type silicon substrate 11 between the N diffused layer 123 and the N diffused layer 124. The N diffused layer 123 and the N diffused layer 124 have a lightly doped region 123A and 124A in a portion adjacent to the gate electrode.

As shown in FIGS. 9, 10, and 11, the N diffused region 122 and the P diffused region 13 are connected through contacts to an aluminum wiring 154, which is in turn connected to the ground line, and the N diffused regions 121 and 123 are connected through contacts to an aluminum wiring (sub line) 155, which is turn connected to the main line 157. The N diffused region 124 is connected through contacts to an aluminum wiring 156, which is in turn connected to the ground line. The gate electrode 17 is connected through an aluminum wiring 157 to an internal circuit (not shown).

Thus, the protection bipolar transistor and the protection diode protect the output transistor. In this second embodiment, by fabricating each protection unit to have a width of 20 µm, the circuit can be effectively protected again a short electrostatic pulse, similarly to the first embodiment.

Figure 12:
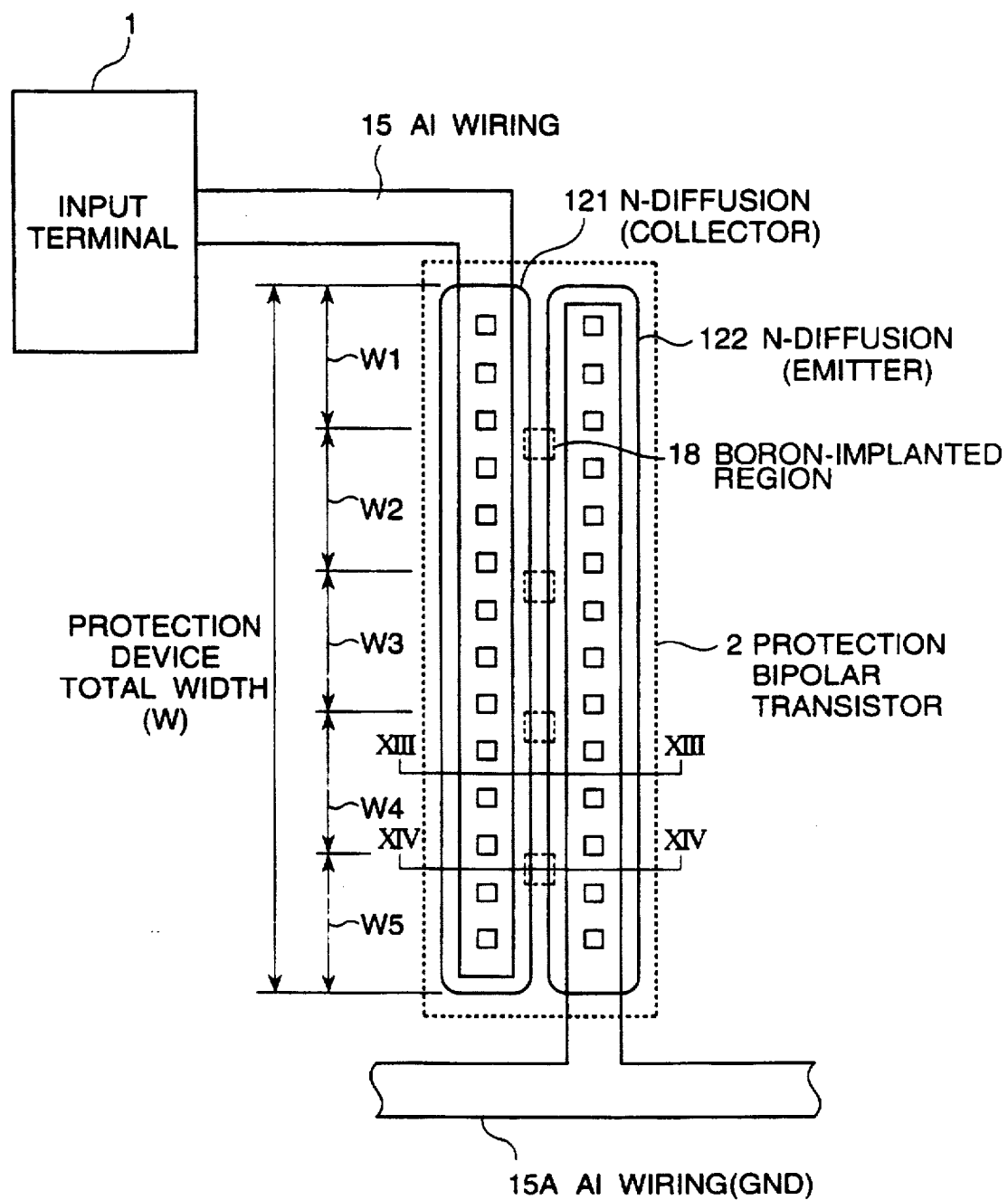
FIG. 12 is a diagrammatic layout of a portion of a third embodiment of the electrostatic breakdown protection circuit in accordance with the present invention.

Referring to FIG. 12, there is shown a diagrammatic layout of a portion of a third embodiment of the electrostatic breakdown protection circuit in accordance with the present invention for an input circuit.

This third embodiment includes a protection bipolar transistor composed of a pair of elongated N diffused layers 121 and 122 formed in a P type semiconductor substrate (11 in FIGS. 13 and 14) separately from each other by a short interval. The N diffused layer 121 is connected through contacts to an aluminum wiring 15 connected to an input terminal 1, and the N diffused layer 122 is connected through contacts to an aluminum wiring 15A, which is in turn connected to ground. This protection bipolar transistor has a total width "W" of 100 μm, but boron ions are implanted into a base region of the protection bipolar transistor between the pair of elongated N diffused layers 121 and 122, at constant intervals "W1", "W2", "W3", "W4" and "W5" of, for example, 20 μm in the shown embodiment, so that a breakdown voltage in the collector-base junction in this boron ion-implanted base region 18 is lowered.

Figure 13:
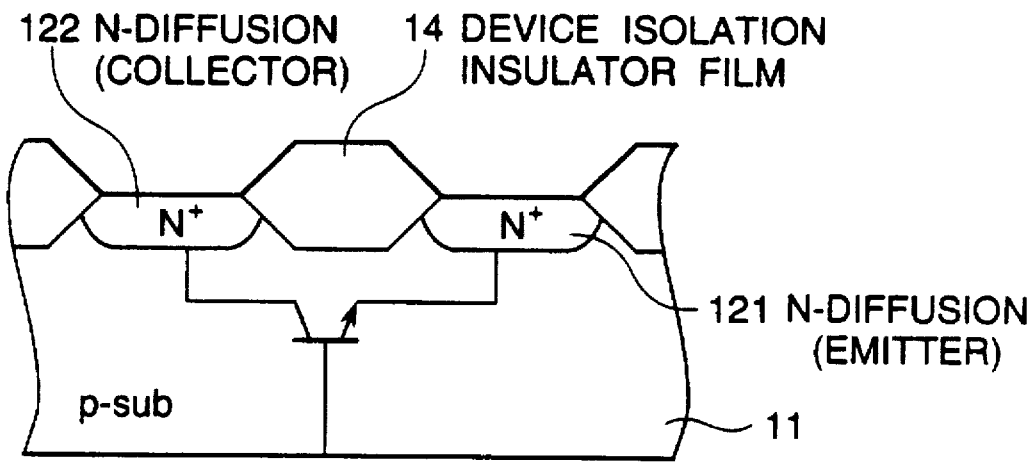
FIG. 13 is a diagrammatic sectional view taken along the line XIII—XIII in FIG. 12.
Figure 14:
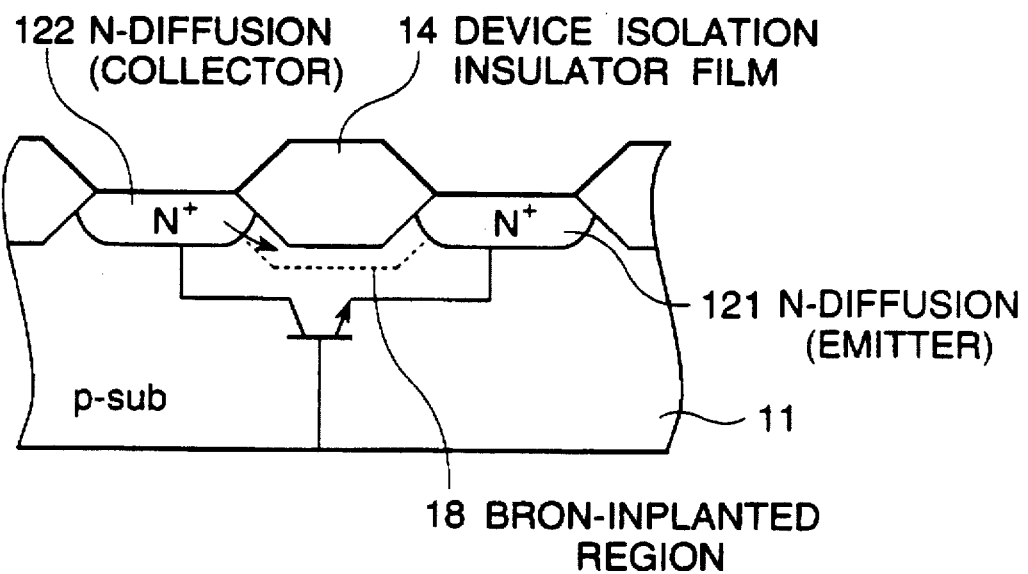
FIG. 14 is a diagrammatic sectional view taken along the line XIV—XIV in FIG. 12.

FIG. 13 is a diagrammatic sectional view taken along the line XIII-XIII in FIG. 12 in an area in which no boron is ion-implanted. FIG. 14 is a diagrammatic sectional view taken along the line XIV-XIV in FIG. 12 in an area in which the boron is ion-implanted. As seen from FIG. 14, the boron ion-implanted base region 18 is formed just under a device isolation insulator film 14, to be continuous to the N-diffused layer 122 of the collector. With this arrangement, when a positive overvoltage pulse is applied to the collector, an avalanche breakdown current flows between the N-diffused layer 122 of the collector and the boron ion-implanted base region 18, as shown by an arrow in FIG. 14. In other words, a current starts to flow between the collector and the emitter, from this boron ion-implanted base region 18. Thus, the parasitic bipolar transistor starts to operate, and the operation of the parasitic bipolar transistor spreads over the whole of the protection device.

In the third embodiment, since a plurality of regions in which the parasitic bipolar transistor operation starts, are provided with intervals of 20 μm, the whole of the protection device operates within a time of about 5 nsec. Therefore, by changing the avalanche breakdown voltage between the collector and the substrate by action of the ion implantation, this third embodiment can have the same advantage as that obtained in the first embodiment in which the width of each of a plurality of protection units is limited.

As seen from the above, according to the present invention, a plurality of protection bipolar transistor units are provided, but the width of each of the protection bipolar transistor units is limited, so as to provide and confine a plurality of parasitic bipolar operation starting regions. Thus, the protection device can efficiently operate for an electrostatic small pulse having a pulse width. Accordingly, the protection device having a high electrostatic protection capability can be formed with a minimum area.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising an external metal terminal formed on a semiconductor substrate of a first conductivity type, an internal circuit formed in said semiconductor substrate and connected to said external metal terminal, and a bipolar transistor having a collector region and an emitter region formed in said semiconductor substrate which are separated from each other by a device isolation insulator film formed on said semiconductor substrate, each of said collector region and said emitter region being formed of a second conductivity type opposite to said first conductivity type, and a base of said bipolar transistor being formed of a portion of said semiconductor substrate between said collector region and said emitter region, one of said collector region and said emitter region being connected to said external metal terminal, another one of said collector region and said emitter region being connected to a predetermined common potential, so that when an electrostatic voltage is applied to said external metal terminal, said bipolar transistor is turned on so as to protect said internal circuit, wherein the improvement comprises a plurality of divided transistors connected in parallel which constitute said bipolar transistor as a whole, each of said divided transistors having a predetermined limited width less than the width of said bipolar transistor so as to increase the operating speed of said bipolar transistor, said divided protection transistors having a substantially equal breakdown voltage of a junction between a collector region and said semiconductor substrate.

2. A semiconductor device claimed in claim 1 wherein each of said divided transistors have a base region ion-implanted with boron.

3. A semiconductor device claimed in claim 1 wherein said predetermined limited width of each of said divided transistors is not greater than 20 μm.

4. A semiconductor device claimed in claim 1, wherein said bipolar transistor comprises a protection bipolar transistor and said divided transistors comprise divided protection transistors, and wherein said collector region is connected to said external metal terminal and said emitter region is connected to said predetermined common potential.

5. A semiconductor device claimed in claim 4, wherein each of said divided protection transistors have a base region ion-implanted with boron.

6. A semiconductor device claimed in claim 4, wherein said predetermined limited width of each of said divided protection transistors is not greater than 20 μm.

* * * * *